(12) United States Patent
Dounia et al.

(10) Patent No.: US 11,852,700 B2
(45) Date of Patent: Dec. 26, 2023

(54) MAGNETIC ELEMENT HAVING AN IMPROVED MEASUREMENT RANGE

(71) Applicant: Crocus Technology SA, Grenoble (FR)

(72) Inventors: Salim Dounia, Grenoble (FR); Claire Baraduc, Chirens (FR); Bernard Dieny, Lans-en-vercors (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 137 days.

(21) Appl. No.: 17/605,069

(22) PCT Filed: Apr. 23, 2020

(86) PCT No.: PCT/IB2020/053837
§ 371 (c)(1),
(2) Date: Oct. 20, 2021

(87) PCT Pub. No.: WO2020/217195
PCT Pub. Date: Oct. 29, 2020

(65) Prior Publication Data
US 2022/0196764 A1    Jun. 23, 2022

(30) Foreign Application Priority Data

Apr. 23, 2019   (EP) .................................... 19315026

(51) Int. Cl.
*G01R 33/09*    (2006.01)
(52) U.S. Cl.
CPC .................................. *G01R 33/098* (2013.01)
(58) Field of Classification Search
CPC .. G01R 33/098; G01R 33/0005; G11C 11/161
See application file for complete search history.

(56) References Cited

U.S. PATENT DOCUMENTS

| | | | |
|---|---|---|---|
| 2014/0218122 A1* | 8/2014 | Locatelli | H03B 15/006 |
| | | | 331/94.1 |
| 2018/0003776 A1* | 1/2018 | Suess | G01R 33/098 |
| 2019/0206931 A1* | 7/2019 | Gajek | H10N 52/00 |

FOREIGN PATENT DOCUMENTS

| | | |
|---|---|---|
| KR | 101728508 B1 | 5/2017 |
| WO | 03/032336 A1 | 4/2003 |

OTHER PUBLICATIONS

International Search Report for PCT/IB2020/053837 dated Jul. 9, 2020.

(Continued)

*Primary Examiner* — Alvaro E Fortich
(74) *Attorney, Agent, or Firm* — Pearne & Gordon LLP

(57) ABSTRACT

Magnetic element including a first ferromagnetic layer having a first magnetization including a stable magnetization vortex configuration having a vortex core. The first ferromagnetic layer includes an indentation configured such that the vortex core nucleates substantially at the indentation. Upon application of an external magnetic field in a first field direction, the vortex core moves along a first path and the first magnetization rotates around the vortex core in a counterclockwise direction. Upon application of the external magnetic field in a second field direction opposed to the first field direction, the vortex core moves along a second path and the first magnetization rotates around the vortex core in a clockwise direction. Both the first and second field path are substantially identical and move the vortex core away from the indentation.

12 Claims, 9 Drawing Sheets

(56) References Cited

OTHER PUBLICATIONS

Written Opinion for PCT/IB2020/053837 dated Jul. 9, 2020.
Chao-Hsien Huang et al.: "Study of One-Sided Flat Edge on Vortex in Submicro-Scaled Permalloy Disks", IEEE Transactions on Magnetics, Jun. 2010, pp. 2264-2267, vol. 46, No. 6, IEEE Service Center, New York, NY, US, XP011309773.
Schneider M et al.: "Magnetic Switching of single vortex permalloy elements", Applied Physics Letters, Nov. 5, 2001, pp. 3113-3115, vol. 79, No. 19, XP012029321.
V. Cambel et al.: "Micromagnetic Simulations of Pac-Man-Like Nanomagnets for Memory Applications", Journal of Nanoscience and Nanotechnology, Sep. 2012, pp. 7422-7425 vol. 12, No. 9, XP055632025.
V. Cambel et al: "Control of vortex chirality and polarity in magnetic nanodots with broken rotational symmetry", pp. 014424-1-014424-5, Physical Review B84, 2011.

* cited by examiner

MAGNETIC ELEMENT HAVING AN IMPROVED MEASUREMENT RANGE

FIELD

The present disclosure concerns a magnetic element comprising: a magnetic tunnel junction having an improved measurement range. The present disclosure further concerns a magnetic sensor comprising a plurality of the magnetic element.

BACKGROUND

A magnetization vortex is a coherent magnetic configuration in micro or nano magnetic structures with magnetization in the plane of the magnetic structure with magnetization rotations on a length scale comparable to the lateral dimension of the surface of the magnetic structure. The magnetization vortex results from an equilibrium between magnetostatic energy and exchange energy for cylindrical or near-cylindrical shaped micro or nano structures in magnetic layers, for which the radius and thickness are sufficiently large. Depending on the geometry of the magnetic structure, the vortex configuration is the stable spin configuration with the lowest energy at remanent state.

In a stable vortex configuration, the vortex can be deformed reversibly without being cancelled. More particularly, the vortex can deform reversibly under a moderate magnetic field. The part of the vortex magnetization parallel to the applied field tends to become larger and the part of the magnetization antiparallel to the applied field tends to become smaller. This causes displacement of the vortex core along the direction transverse to the direction of the applied field. When the magnetic field is reduced, the vortex core gradually returns to its equilibrium position in zero field. The equilibrium position of the vortex core in the case of a disk-shaped microstructure or nanostructure is at the center of the disk.

FIG. 1 shows a plan view of a ferromagnetic layer 21 having a magnetization 210. The magnetization 210 represented by the arrows comprises a magnetization vortex. More particularly, the magnetization vortex has a vortex center, or vortex core, 211 with out of plane magnetization and in-plane magnetization rotating around the vortex core 211 with a clockwise or counter clockwise direction.

In particular, FIG. 1a represents the first magnetization vortex in the absence of the external magnetic field 42, with the vortex core 211 being substantially at a center of the first ferromagnetic layer cross-section. In this configuration, the first ferromagnetic layer 21 has a net magnetic moment that is substantially zero (H=0).

Applying the external magnetic field $H_x$ along the easy axis of the first ferromagnetic layer 21 (along the x direction in FIG. 1), causes the vortex core 211 to move in a direction being substantially perpendicular to the easy axis of the first ferromagnetic layer 21. In FIG. 1b, the vortex core 211 moves in a first displacement direction (upwards in FIG. 1b) upon applying the external magnetic field in a first field direction $-H_x$ represented toward the left in the figure. The displacement in the first displacement direction (shown by the arrow 212) of the vortex core 211 (FIG. 1b) results in a net magnetic moment H<0 in the first ferromagnetic layer 21. FIG. 1c shows the vortex core 211 being moved in a second displacement direction (downwards in FIG. 1c) upon applying the external magnetic field in a second field direction $H_x$, opposed to the first field direction $-H_x$. The displacement of the vortex core 211 in the second displacement direction (shown by the arrow 213) results in a net magnetic moment H>0 in the first ferromagnetic layer 21.

FIG. 2 represents a magnetization curve M-H for the first ferromagnetic layer 21 of FIG. 1, showing the variation in the magnetization 210 of the first ferromagnetic layer 21 under the effect of the external magnetic field H.

For the external magnetic field being between -Hs and Hs (where Hs is the vortex cancellation field), the vortex configuration exists and its vortex core 211 is moved elastically and reversibly in the plane of the first ferromagnetic layer 21. For a field stronger than Hs or stronger than -Hs (in the opposite direction), the vortex is cancelled and the magnetic layer changes into an essentially single domain configuration. When the external magnetic field drops below saturation, the vortex configuration renucleates. Thus, there is some hysteresis with cancellation and nucleation of the vortex configuration whereas the entire part corresponding to elastic deformation of the vortex is perfectly reversible.

FIGS. 1 and 2 represent, respectively, a vortex micromagnetic configuration of magnetization 210 and its corresponding magnetization curve M-H for an ideal case wherein the first ferromagnetic layer 21 has no defect. In such ideal case, no offset is observed in the R-H curve. In other words, the path of displacement of the vortex core 211 in the first and second displacement directions 212, 213 has no effect on the magnetization curve M-H.

FIG. 3 shows a plan view of the first ferromagnetic layer 21 comprising defects 30. When the vortex core 211 moves in the first displacement direction 212, it is trapped into (then detrapped from) the defects 30 encountered in the path of displacement. Similarly, the vortex core 211 moving in the second displacement direction 213 is trapped into (and detrapped from) the defects 30 encountered in the path of displacement. Depending on its position at nucleation, the vortex core 211 can be trapped and detrapped in different defects 30 when moving in the first displacement direction 212 than when moving in the second displacement direction 213. Due to this trapping/detrapping into different defects, the vortex core 211 may follow a different path in the first and second displacement directions 212, 213 (as shown in FIG. 3). In a magnetic tunnel junction comprising a tunnel barrier layer sandwiched between the first ferromagnetic layer 21 and a second ferromagnetic layer having a second magnetization, the vortex core 211 following a different path in the first and second displacement directions 212, 213 results in different magnetization distributions of the first magnetization 210 and thus, different resistances of the magnetic tunnel junction at each value of the external magnetic field H.

FIG. 4 represents a magnetization curve M-H for the ferromagnetic layer 21 of FIG. 3, showing the variation in the first magnetization 210 of the first ferromagnetic layer 21 under the effect of the external magnetic field 42. The vortex core 211 following a different path in the first and second displacement directions 212, 213 translates into an offset ΔM between the M-H curve when the external magnetic field 42 is applied in the first field direction $-H_x$ compared to when the external magnetic field 42 is applied in the second field direction $H_x$. The offset ΔM can also be not reproducible. Moreover, an offset can also be observed in a R-H curve, i.e., in the variation in the resistance of the magnetic tunnel junction as a function of the external magnetic field 42.

This offset is detrimental for sensors applications as it decreases the measurement range allowed. Current approaches for this non-reproducibility effect is to reduce the range of application and/or limiting the performances of sensors.

SUMMARY

The present disclosure concerns a magnetic element comprising a magnetic tunnel junction element including a tunnel barrier layer sandwiched between a first ferromagnetic layer having a first magnetization and a second ferromagnetic layer having a second magnetization; a field device configured to apply an external magnetic field adapted for varying the orientation of the first magnetization while the orientation of the second magnetization remain unchanged; the first ferromagnetic layer being configured such that the first magnetization comprises a stable magnetization vortex configuration; wherein the first ferromagnetic layer is further configured to comprise an indentation such that a vortex core of the magnetization vortex, upon vortex nucleation or renucleation, is located substantially at the indentation; and wherein, when the external magnetic field is applied in a first field direction the vortex core moves along a first path and the first magnetization rotates around the vortex core in a counterclockwise direction; and when the external magnetic field is applied in a second field direction opposed to the first field direction, the vortex core moves along a second path and the first magnetization rotates around the vortex core in a clockwise direction. Both the first and second field path are substantially identical and move the vortex core away from the indentation.

The present disclosure further concerns a magnetic sensor comprising a plurality of the magnetic element.

The magnetic element has an improved measurement range. The magnetic element further has good reproducibility of the response after application of a high magnetic field bias.

based on one or several magnetic dots with one or several cuts (flat edge, notch). This geometry allows controlling the vortex core path inside the dot, thus ensuring a good reproducibility

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 5:
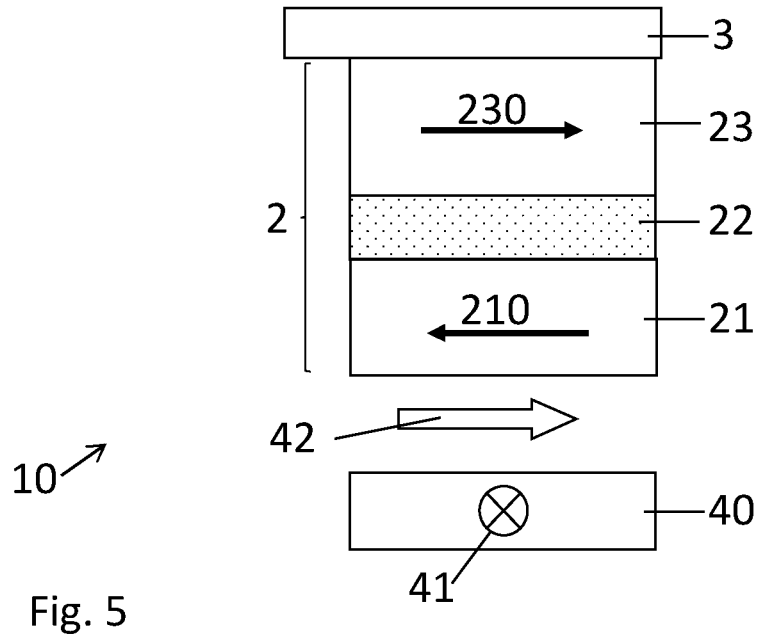
FIG. 5 shows a cross-section view of a conventional magnetic element comprising a tunnel barrier layer sandwiched between a first ferromagnetic layer having first magnetization and a second ferromagnetic layer.

FIG. 5 shows a cross-section view of a magnetic element 10 comprising a magnetic tunnel junction 2. The magnetic tunnel junction comprising a tunnel barrier layer 22 sandwiched between a first ferromagnetic layer 21 having a first magnetization 210 and a second ferromagnetic layer 23 having a second magnetization 230. The magnetic element 10 further comprises a field line 40 arranged for passing a field current 41 such as to generate an external magnetic field 42. The first magnetization 210 can be configured to be orientable in the external magnetic field 42 while the orientation of the second magnetization 230 remain unchanged. In such configuration, the external magnetic field 42 can be used (depending on the polarity of the external magnetic field 42) to switch the first magnetization 210 from an orientation parallel to the second magnetization 230 to an orientation antiparallel to the second magnetization 230, or vice-versa. When the first magnetization 210 is parallel to the second magnetization 230 the resistance of the MRAM cell 10 is low (logic state "0"). When the first magnetization 210 is antiparallel to the second magnetization 230 the resistance of the MRAM cell 10 is high (logic state "1"). The external magnetic field 42 need not be generated using the field line but may also be generated by using a permanent magnet arrangement (not shown) or any other suitable field device adapted for generating the external magnetic field 42.

Figure 6:
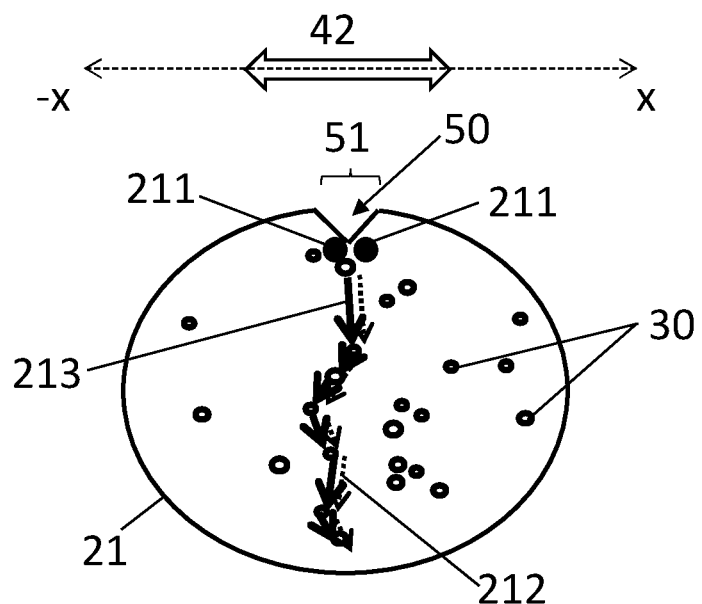
FIG. 6 shows a plan view of a first ferromagnetic layer, according to an embodiment.

FIG. 6 shows a plan view of the first ferromagnetic layer 21, according to an embodiment. In the plane of the first magnetization 201, the first ferromagnetic layer 21 has an elliptical shape with an eccentricity between 0 and less than 1. A peripheric portion 51 of the periphery of the first ferromagnetic layer 21 is partially cut out such as to form an indentation 50 at the periphery of the first ferromagnetic layer 21 and extending in the radial direction of the first ferromagnetic layer 21. In this configuration, the magnetization vortex nucleates from the indentation 50. Thus, in the absence of the external magnetic field 42, the vortex core 211 is located near the indentation 50 (in the axis line perpendicular to field direction). The indentation 50 plays the role of a controlled nucleation site for the magnetization vortex.

The first ferromagnetic layer 21 does not necessarily need to have an elliptical shape but should have a geometry such that the first magnetization comprises a stable vortex configuration.

Applying the external magnetic field 42 in a direction substantially parallel to the tangent of the peripheric portion 51 and along the plane parallel to the first ferromagnetic layer 21 (represented by the axis "-x"-"x" in FIG. 6), causes the vortex core 211 to move in a direction being substantially perpendicular to the tangent of the peripheric portion 51. In one aspect, the vortex core 211 moves in the first ferromagnetic layer 21 from its initial position in the vicinity of the indentation 50 (or substantially at the indentation 50), when the external magnetic field 42 corresponds to the nucleation field Hn at which the vortex configuration nucleates, or renucleates, in a direction being substantially perpendicular to the tangent of the peripheric portion 51. In other words, applying the external magnetic field 42 in a first field direction $-H_x$ moves the vortex core 211 in a first displacement direction 212. The first magnetization 210 rotates around the vortex core 211 in a counterclockwise direction, in the plane of the first ferromagnetic layer 21. Applying the external magnetic field 42 in a second field direction $H_x$, opposed to the first field direction $-H_x$, moves the vortex core 211 in a second displacement direction 213. The first magnetization 210 rotates around the vortex core 211 in a clockwise direction, in the plane of the first ferromagnetic layer 21. Both the first and second displacement directions 212, 213 of the vortex core 211 are away from its initial position in the vicinity of the indentation 50 and substantially perpendicular to the tangent of the peripheric portion 51.

In another aspect, the initial position in the vicinity of the indentation 50 (or substantially at the indentation 50) of the vortex core 211 upon vortex nucleation or renucleation (at the nucleation field Hn) is substantially identical when the external magnetic field 42 is applied in the first and second field direction $-H_x$, $H_x$. When the vortex core 211 moves in the first and second displacement directions 212, 213, it encounters substantially the same defects 30 and is trapped and detrapped into substantially the same defects 30. Thus, the path of displacement of the vortex core 211 in the first and second displacement directions 212, 213 is substantially identical (as can be seen in FIG. 6).

Figures 1A, 1B, 1C:
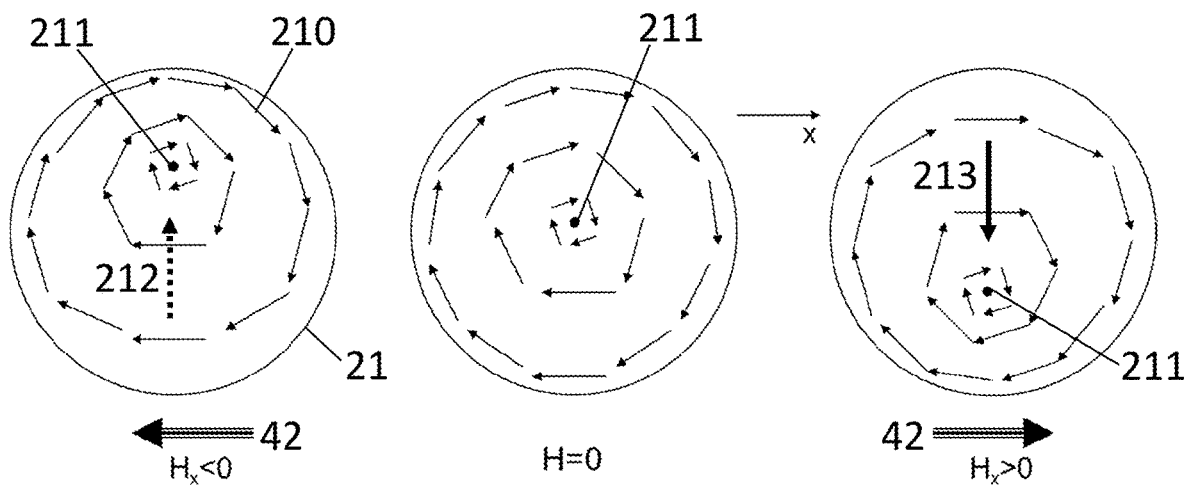
FIG. 1 shows a plan view of the first magnetization in a vortex configuration.
Figure 2:
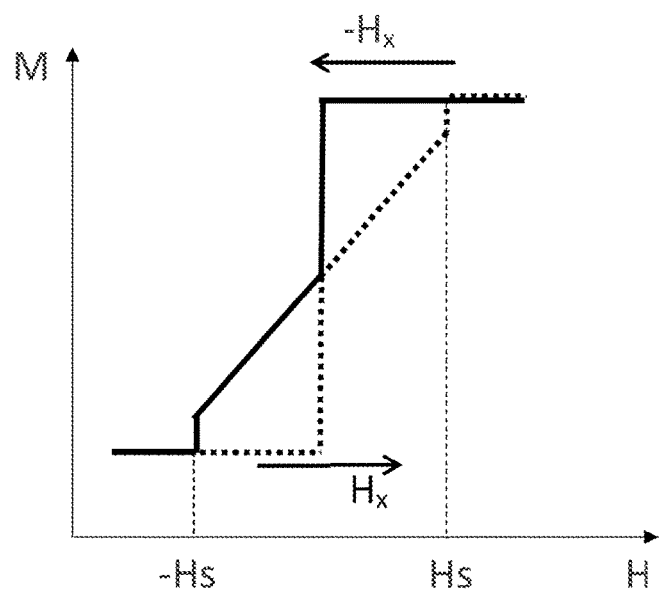
FIG. 2 shows a variation in the first magnetization under the effect of an external magnetic field for the first ferromagnetic layer of FIG. 2.
Figure 3:
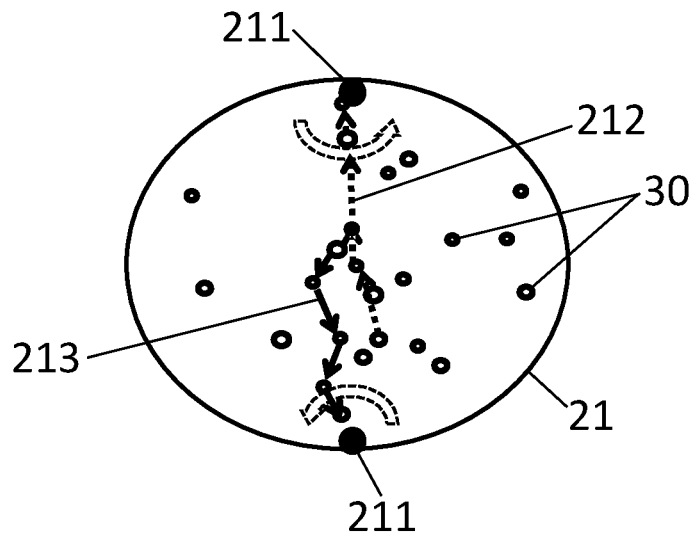
FIG. 3 shows a plan view of a first magnetization in a vortex configuration when the first ferromagnetic layer comprises defects.
Figure 4:
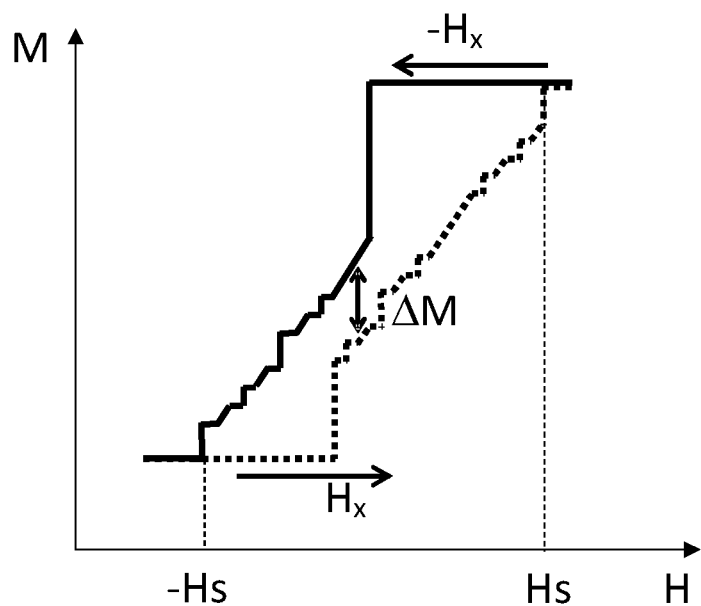
FIG. 4 shows a variation in the first magnetization under the effect of an external magnetic field for the first ferromagnetic layer of FIG. 3.
Figure 7:
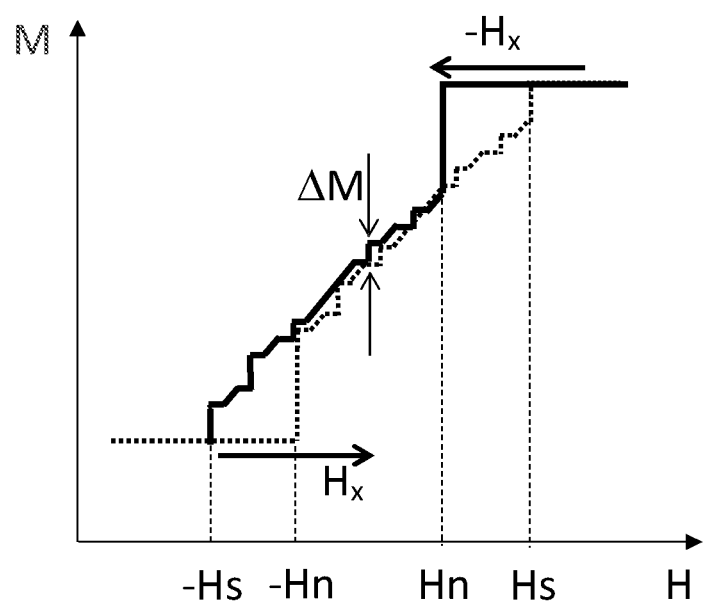
FIG. 7 shows a variation in the first magnetization under the effect of an external magnetic field for the first ferromagnetic layer of FIG. 6.

FIG. 7 represents a magnetization curve M-H for the first ferromagnetic layer 21 of FIG. 6, showing the variation in the first magnetization 210 of the first ferromagnetic layer 21 under the effect of the external magnetic field 42. The substantially identical path of displacement of the vortex core 211 in the first and second displacement directions 212, 213 results in a similar magnetization distribution of the first magnetization 210 when the external magnetic field 42 is applied in the first and second direction $-H_x$, $H_x$. An offset ΔM between the M-H curve when the external magnetic field 42 is applied in the first field direction $-H_x$ compared to when the external magnetic field 42 is applied in the second field direction $H_x$ is much reduced compared to a ferromagnetic layer without the indentation 50 (see FIG. 4). In fact, the offset ΔM can be substantially null.

FIG. 8 illustrates a plan view of the first ferromagnetic layer 21 according to embodiments. In the plane of the first magnetization 201, the the first ferromagnetic layer 21 has an elliptical shape aspect ratio of about 1.3, wherein the aspect ratio denotes the ratio of the major axis to the minor axis. A peripheric portion 51 of the periphery of the first ferromagnetic layer 21 is partially cut out such as to form an indentation 50 at the periphery of the first ferromagnetic layer 21 and extending in the radial direction of the first ferromagnetic layer 21.

Figure 8A:
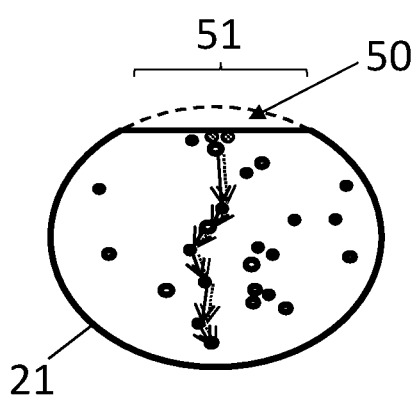
FIG. 8 illustrates the first ferromagnetic layer according to embodiments.
Figure 8B:
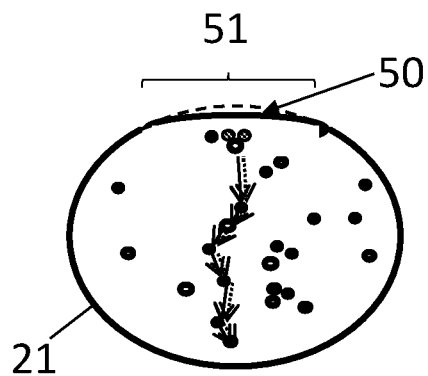

More particularly, in FIGS. 8a and 8b the indentation 50 comprises a notch formed by partially cutting out the periphery of the first ferromagnetic layer 21 in a more or less circular arc shape. In FIG. 8a the indentation 50 results in a substantially flat peripheric portion 51. In FIG. 8b, the notch is formed such as to result in a slightly convex peripheric portion 51. The flat peripheric portion 51 can be orientation substantially parallel to the orientation of the external magnetic field 42.

Figure 8C:
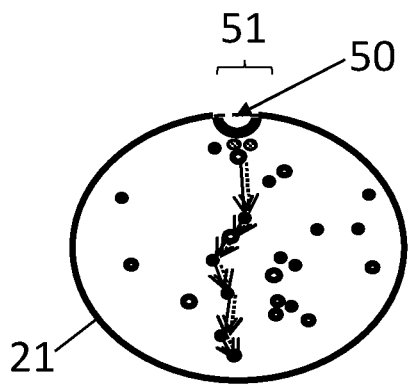
Figure 8D:
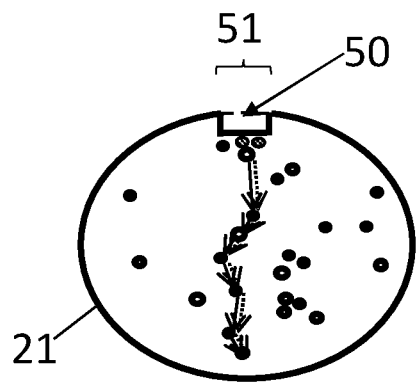

Another example is shown in FIG. 8c, wherein the indentation 50 comprises a notch having the shape of a circular groove. Yet another example is shown in FIG. 8d, wherein the indentation 50 comprises a notch having the shape of a rectangular groove. The first ferromagnetic layer 21 shown in FIG. 6 comprises a V-shaped indentation 50. As discussed above, the indentation 50 cause the magnetization vortex to nucleate in the vicinity of the indentation 50 and results in the first and second displacement directions 212, 213 of the vortex core 211 to be substantially identical. The offset ΔM in the corresponding magnetization curve M-H is thus significantly reduced (the offset ΔM can be substantially null). The magnetic element 10 can thus have an increased measurement range compared to a magnetic element having a ferromagnetic layer without indentation 50.

Figure 8E:
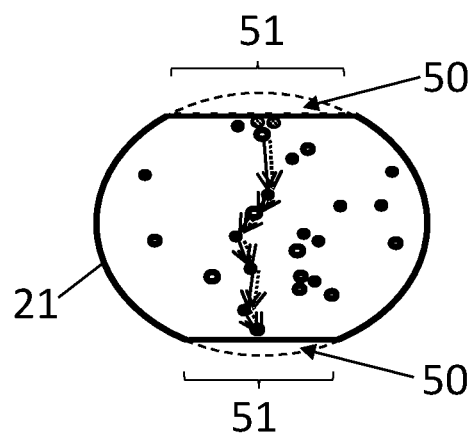

As shown in FIG. 8e, the first ferromagnetic layer 21 comprises two indentations 50 resulting in a substantially flat peripheric portion 51 and diametrically opposite to each other. The flat peripheric portions 51 can be orientation substantially parallel to the orientation of the external magnetic field 42. In order to obtain a substantially identical path of displacement of the vortex core 211 in the first and second displacement directions 212, 213, the two indentations 50 should be asymmetric arranged. In the example of FIG. 8e, asymmetry is achieved by providing flat peripheric portions 51 of different size.

More generally, the first ferromagnetic layer 21 can comprise more than one indentation 50. The plurality of indentations 50 should be asymmetric arranged.

Figure 9:
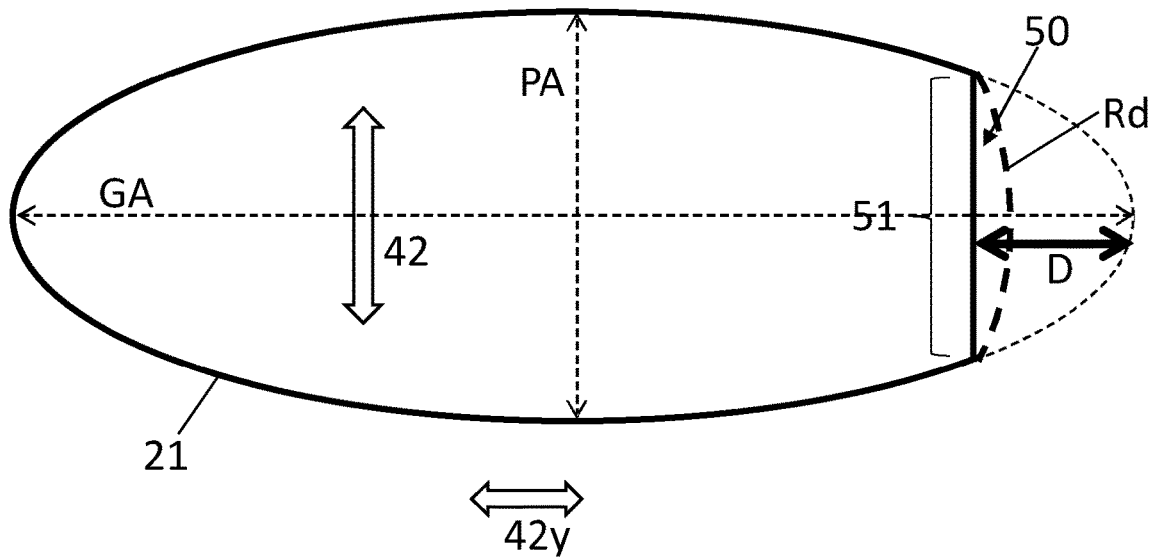
FIG. 9 illustrates a plan view of the first ferromagnetic layer according to another embodiment.

FIG. 9 illustrates a plan view of the first ferromagnetic layer 21 according to another embodiment. In the plane of the first magnetization 201, the first ferromagnetic layer 21 has an elliptical shape aspect ratio being above 1.5. In the figure, the major axis is denoted by GA and the minor axis is denoted by PA. The indentation 50 comprises a notch formed by partially cutting out the periphery of the first ferromagnetic layer 21 at one of its vertexes in a substantially flat peripheric portion 51 (solid line). Also represented in the figure is the indentation 50 comprising a notch formed such as to form in a slightly convex peripheric portion 51 (broken line). The depth D of the indentation 50 can be about 0.1 PA. In the case of the convex peripheric portion 51, the radius Rd the peripheric portion 51 can be about 0.5 D. The peripheric portions 51 can be orientation substantially parallel to the orientation of the external magnetic field 42. For example, the first ferromagnetic layer 21 can be arranged such that the external magnetic field 42 is oriented substantially parallel to the minor axis PA. This configuration of the first ferromagnetic layer 21 allows for an orthogonal component 42y of the external magnetic field, orthogonal to the external magnetic field 42 applied substantially parallel to the minor axis PA, to be below 50 mT.

Figure 10:
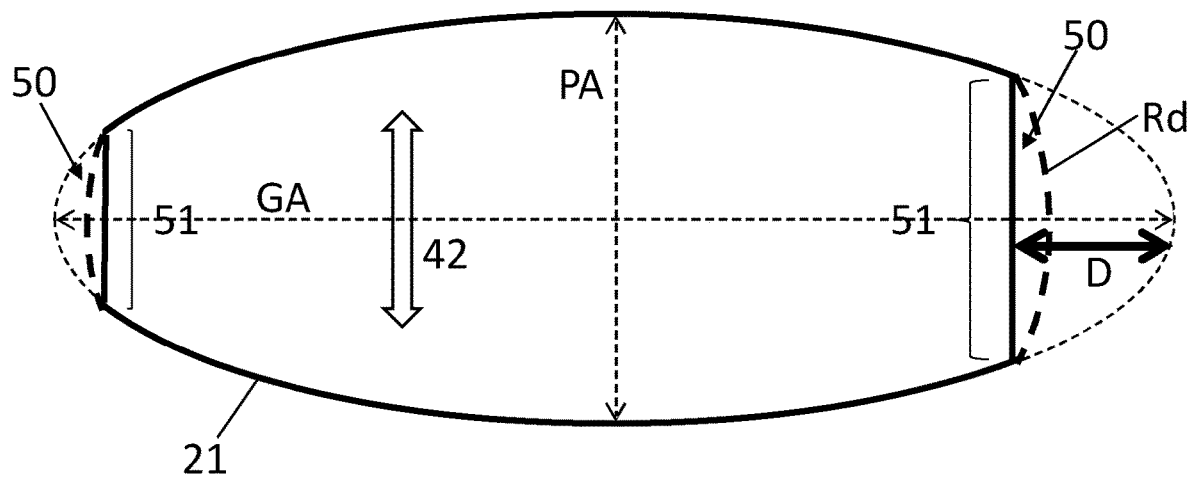
FIG. 10 illustrates a variant of the first ferromagnetic layer of FIG. 9.

FIG. 10 illustrates a variant of the first ferromagnetic layer 21 of FIG. 9 wherein the first ferromagnetic layer 21 comprises another indentation 50. The other indentation 50 comprises a notch formed by partially cutting out the periphery of the first ferromagnetic layer 21 at the other vertex in a substantially flat peripheric portion 51 (solid line). Also represented in the figure is the other indentation 50 comprising a notch formed such as to form in a slightly convex peripheric portion 51 (broken line). The two indentations 50 are diametrically opposite to each other. In order to obtain a substantially identical path of displacement of the vortex core 211 in the first and second displacement directions 212, 213, the two indentations 50 should be asymmetric arranged. In the example of FIG. 10, asymmetry is achieved by providing the peripheric portions 51 of one of the indentations 50 with a smaller (or larger) depth.

The peripheric portions 51 of the two indentations 50 can be orientation substantially parallel to the orientation of the external magnetic field 42. For example, the first ferromagnetic layer 21 can be arranged such that the external magnetic field 42 is oriented substantially parallel to the minor axis PA.

Figure 11:
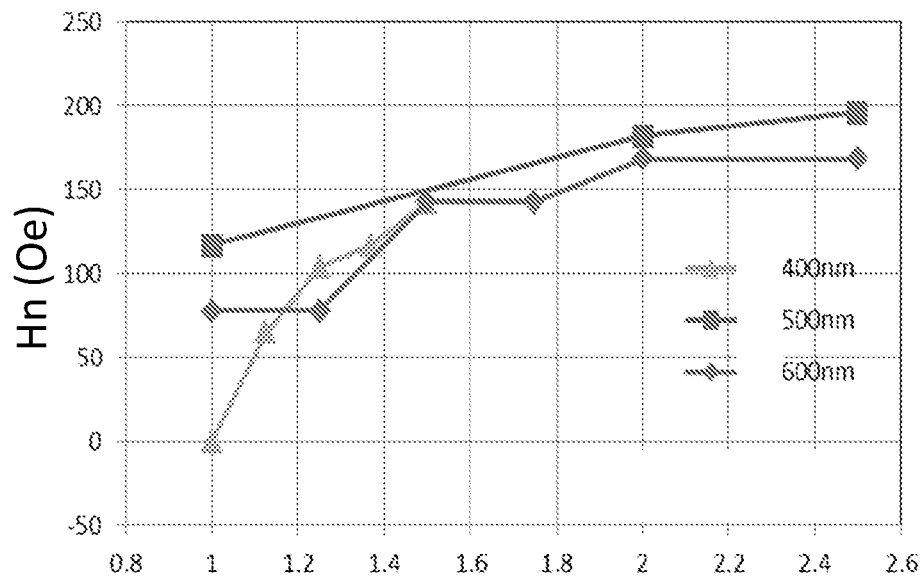
FIG. 11 reports the nucleation field as a function of aspect ratio of the first ferromagnetic layer for various values of the minor axis.

The graph of FIG. 11 reports the nucleation field Hn as a function of aspect ratio AR of the first ferromagnetic layer 21 having a minor axis PA of 400 nm, 500 nm and 600 nm. The nucleation field Hn corresponds to the value of the external magnetic field 42 at which the vortex configuration nucleates, or renucleates, when the external magnetic field 42 is below the vortex cancellation field, or expulsion field, Hs (see FIG. 7).

Figure 12:
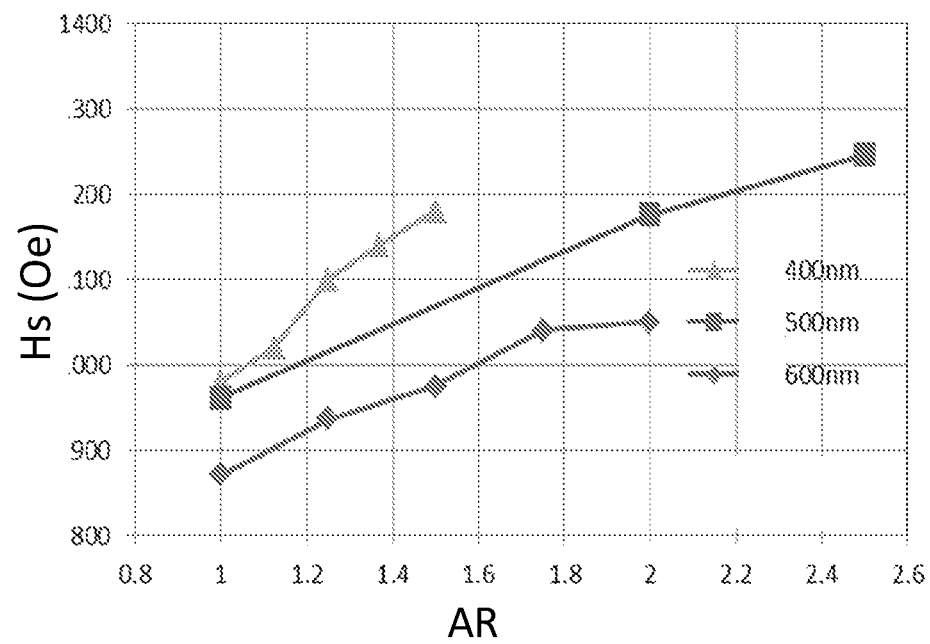
FIG. 12 reports the vortex cancellation field as a function of aspect ratio of the first ferromagnetic layer for various values of the minor axis.

The graph of FIG. 12 reports the vortex cancellation field Hs as a function of aspect ratio AR of the first ferromagnetic layer 21 having a minor axis PA of 400 nm, 500 nm and 600 nm. For both graphs of FIGS. 11 and 12, the external magnetic field 42 is applied substantially parallel to the peripheric portions 51 and to the minor axis PA (see FIGS. 9 and 10). The orthogonal component 42$y$ is assumed to be null.

FIGS. 11 and 12 show that increasing the aspect ratio AR of the first ferromagnetic layer 21 yields higher values of the nucleation field Hn and of the vortex cancellation field Hs (regardless of the size of the first ferromagnetic layer 21). High values of the nucleation field Hn and of the vortex cancellation field Hs are desired in order to have a wide measurement range of the magnetic element 10. A similar vortex cancellation field Hs for different sizes of the first ferromagnetic layer 21 can be obtained by adjusting aspect ratio AR of the first ferromagnetic layer 21. However, the aspect ratio AR is limited by other magnetization configurations more stable than vortex configuration, for example macrospin configuration is favored for high aspect ratios.

Figure 13:
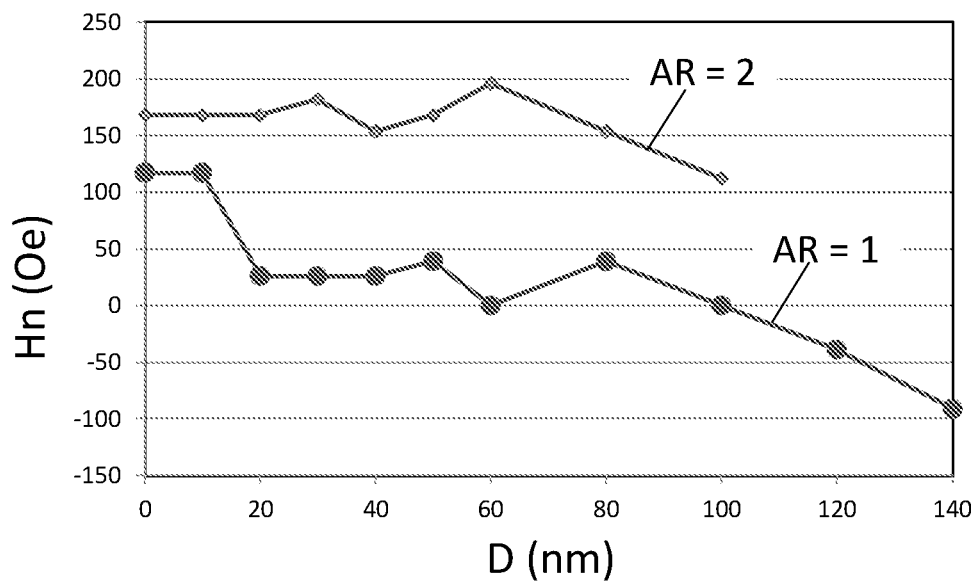
FIG. 13 reports the nucleation field as a function of the depth of the indentation having a substantially flat peripheric portion.

The graph of FIG. 13 reports the nucleation field Hn as a function of the depth of the indentation 50 having a substantially flat peripheric portion 51. The indentation 50 having a substantially flat peripheric portion 51 allows for controlling nucleation position (at peripheric portion 51) and circularity of the vortex, i.e., clockwise for the external magnetic field 42 being applied in the second field direction $H_x$ and counterclockwise for the external magnetic field 42 being applied in the first field direction $-H_x$.

Figure 14:
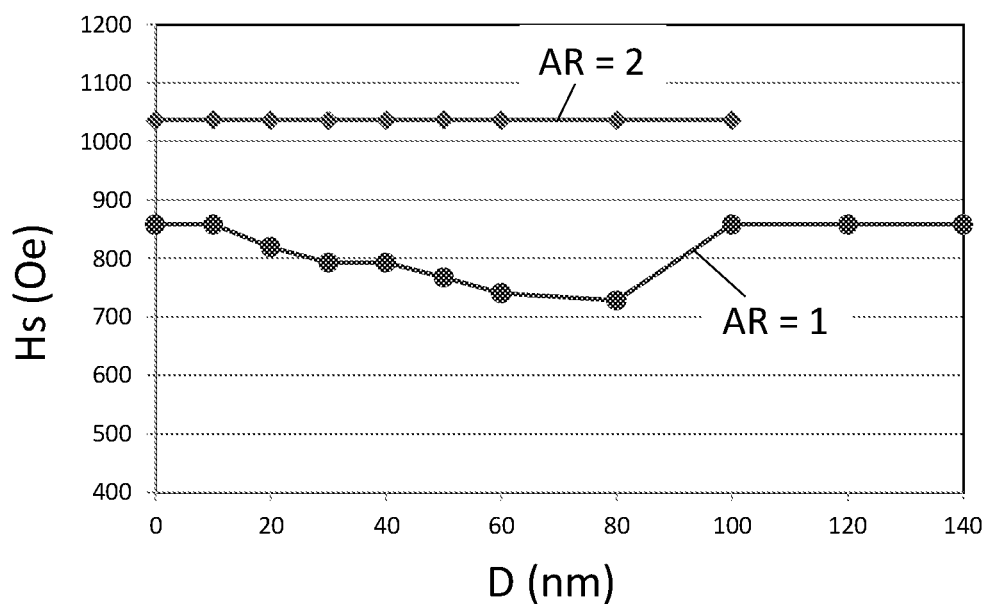
FIG. 14 reports the vortex cancellation field as a function of the depth of the indentation having a substantially flat peripheric portion.

In FIG. 14, a graph reports the vortex cancellation field Hs as a function of the depth of the indentation 50 having a substantially flat peripheric portion 51. In both FIGS. 13 and 14, the values are reported for the first ferromagnetic layer 21 having a minor axis PA of 600 nm and for two aspect ratios AR, namely AR=1 (circles) and AR=2 (lozenges). For both graphs of FIGS. 13 and 14, the external magnetic field 42 is applied substantially parallel to the peripheric portions 51 and to the minor axis PA (see FIGS. 9 and 10). The orthogonal component 42$y$ is assumed to be null.

FIGS. 13 and 14 show that a high aspect ratio AR leads to a good path control. A better path control is obtained for a high nucleation field Hn and for a high vortex cancellation field Hs. In particular, a good path control is obtained for an indentation depth D≥10 nm for aspect ratio AR=2 and for an indentation depth D≥100 nm for aspect ratio AR=1. More particularly, for aspect ratio AR=1, a decrease of the nucleation field Hn and vortex cancellation field Hs is observed when the indentation depth D increases. For the aspect ratio AR=2, high and more or less constant values are obtained for the nucleation field Hn and the vortex cancellation field Hs, when the indentation depth D≤60 nm. Optimum values of the nucleation field Hn and the vortex cancellation field Hs are obtained when the indentation depth D is about 10% the length of the minor axis PA.

More generally, optimum values of the nucleation field Hn and the vortex cancellation field Hs are obtained when the indentation depth D is between about 10% and about 30% the smaller dimension of the first ferromagnetic layer 21, the smaller dimension being measured in the plane of the first ferromagnetic layer 21. For example, for the first ferromagnetic layer 21 having an elliptical shape, the indentation depth D is between about 10% and about 30% the length of the minor axis PA of the first ferromagnetic layer 21. For the ferromagnetic layer 21 having a circular shape, the indentation depth D is between about 10% and about 30% the diameter of the first ferromagnetic layer 21. The indentation depth D smaller than 10% the smaller dimension of the first ferromagnetic layer 21 results to loss of chirality control. In other words, the indentation depth D may not allow the magnetization vortex to nucleate substantially at the indentation 50 and good path control of displacement of the vortex core 211 may be prevented. The indentation depth D larger than 30% the smaller dimension of the first ferromagnetic layer 21 results in low nucleation field Hn and thus a narrow measurement range of the magnetic element 10. A narrow measurement range is detrimental for sensor application of the magnetic element 10. For example, the use of a flat indentation that cuts the first ferromagnetic layer 21 in half (D>50% diameter) results in a substantially zero measurement range.

Figure 15:
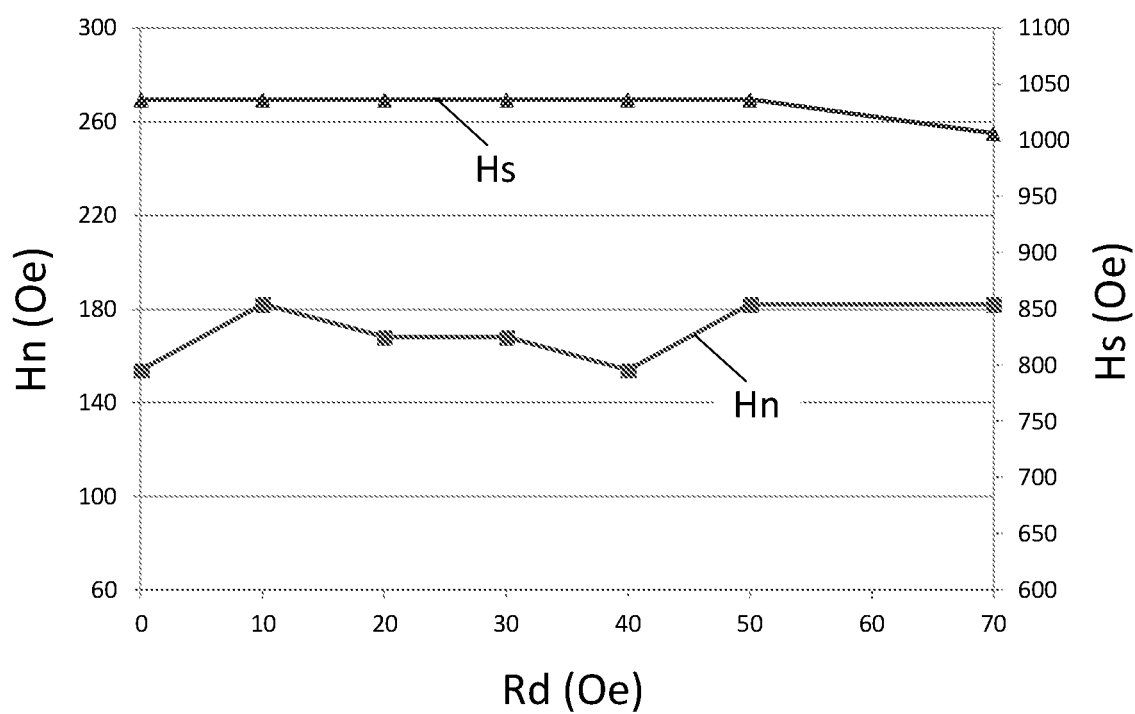
FIG. 15 reports the nucleation field and the vortex cancellation field as a function of the radius of the peripheric portion.

The graph shown in FIG. 15 reports the nucleation field Hn and the vortex cancellation field Hs as a function of the radius Rd of the peripheric portion 51, for a minor axis PA of 600 nm, and aspect ratio AR of 2 and an indentation depth D of 80 nm. The orthogonal component 42$y$ is assumed to be null. The radius Rd of the peripheric portion 51 is modelled with half-ellipse. The figure shows that the path of displacement of the vortex core 211 in the first and second displacement directions 212, 213 is substantially identical ("single" path of the vortex core 211) is obtained for a radius Rd of about 50% the indentation depth D, i.e., a radius Rd≤40 nm. Outside these values, two vortex configuration appear. For a radius Rd equal or smaller than 50% the indentation depth D, more or less constant values of the nucleation field Hn and the vortex cancellation field Hs are obtained.

The robustness of the "single" path of the vortex core 211 in the first ferromagnetic layer 21 to the presence of a non-null orthogonal component 42$y$ was tested by applying the non-null orthogonal component 42$y$ when a magnetization vortex is already nucleated from the vortex cancellation field Hs. By observing the distribution of the first magnetization 210 during and after the application of the non-null orthogonal component 42$y$, it was shown that the "single" path of the vortex core 211 is maintain for a orthogonal component 42$y$ equal or below 450 Oe.

In an embodiment, a magnetic sensor (not shown) comprises a plurality of the magnetic element 10.

REFERENCE NUMBERS AND SYMBOLS

| | |
|---|---|
| 10 | magnetic device |
| 2 | magnetic tunnel junction |
| 21 | first ferromagnetic layer |
| 210 | first magnetization |
| 211 | vortex core |
| 212 | displacement of the vortex core in the first direction |
| 213 | displacement of the vortex core in the second direction |
| 22 | tunnel barrier layer |
| 23 | second ferromagnetic layer |
| 230 | second magnetization |
| 30 | defects |
| 40 | field line |
| 41 | field current |
| 42 | external magnetic field |
| 42y | orthogonal component of the external magnetic field |
| 50 | indentation |
| 51 | peripheric portion |
| ΔM | offset |
| AR | aspect ratio |
| D | depth of the indentation |
| GA | major axis |
| Hn | nucleation field |
| Hs | vortex cancellation field |
| -Hx | first field direction |
| Hx | second field direction |
| PA | minor axis |
| Rd | radius peripheric portion |

The invention claimed is:

1. A magnetic element comprising:
a magnetic tunnel junction element including a tunnel barrier layer sandwiched between a first ferromagnetic layer having a first magnetization and a second ferromagnetic layer having a second magnetization; and
a field device configured to apply an external magnetic field adapted for varying the orientation of the first magnetization while the orientation of the second magnetization remain unchanged;
wherein the first ferromagnetic layer is configured such that the first magnetization comprises a stable magnetization vortex configuration;
wherein the first ferromagnetic layer is further configured to comprise an indentation such that a vortex core of the magnetization vortex, upon vortex nucleation or renucleation, is located substantially at the indentation;
wherein when the external magnetic field is applied in a first field direction the vortex core moves along a first path and the first magnetization rotates around the vortex core in a counterclockwise direction in the plane of the first ferromagnetic layer;
wherein when the external magnetic field is applied in a second field direction opposed to the first field direction, the vortex core moves along a second path and the first magnetization rotates around the vortex core in a clockwise direction in the plane of the first ferromagnetic layer;
wherein both the first and second field path are substantially identical and move the vortex core away from the indentation;
wherein the first ferromagnetic layer has an elliptical shape with an aspect ratio between 1 and 2, an indentation depth of the indentation being 0.1 the minor axis of the ellipse; and
wherein the indentation comprises a convex peripheric portion along the periphery of the first ferromagnetic layer and the radius of the peripheric portion being 0.5 the depth.

2. The magnetic element according to claim 1, wherein the indentation comprises a substantially flat peripheric portion along the periphery of the first ferromagnetic layer.

3. The magnetic element according to claim 1, wherein the indentation comprises a circular shaped notch along the periphery of the first ferromagnetic layer.

4. The magnetic element according to claim 1, wherein the indentation comprises a rectangular or rectangular shaped notch along the periphery of the first ferromagnetic layer.

5. The magnetic element according to claim 1, comprising more than one indentation,
wherein the shape of each indentation is asymmetric relative to the shape of the other indentations.

6. The magnetic element according to claim 1, wherein the indentation depth is between 10% and 30% of the smaller dimension in the plane of the first ferromagnetic layer.

7. The magnetic element according to claim 1, wherein the first ferromagnetic layer has an aspect ratio of 1.5.

8. The magnetic element according to claim 7, wherein the indentation depth is between 10% and 30% of the length of the minor axis of the first ferromagnetic layer.

9. The magnetic element according to claim 1, wherein the peripheric portion is orientated substantially parallel to the orientation of the external magnetic field.

10. The magnetic element according to claim 1, wherein said field device comprises a field line arranged for passing a field current such as to generate the external magnetic field.

11. The magnetic element according to claim 1, wherein the first ferromagnetic layer comprises at least another indentation.

12. A magnetic sensor comprising a plurality of the magnetic element according to claim 1.

* * * * *